US012787812B2

(12) United States Patent
Haba

(10) Patent No.: US 12,787,812 B2
(45) Date of Patent: *Nov. 3, 2026

(54) BONDED STRUCTURE WITH INTERCONNECT STRUCTURE

(71) Applicant: ADEIA SEMICONDUCTOR BONDING TECHNOLOGIES INC., San Jose, CA (US)

(72) Inventor: Belgacem Haba, Saratoga, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 96 days.

This patent is subject to a terminal disclaimer.

(21) Appl. No.: 18/990,190

(22) Filed: Dec. 20, 2024

(65) Prior Publication Data

US 2025/0279365 A1 Sep. 4, 2025

Related U.S. Application Data

(63) Continuation of application No. 18/339,137, filed on Jun. 21, 2023, now Pat. No. 12,176,294, which is a (Continued)

(51) Int. Cl.
*H10W 70/60* (2026.01)
*H10W 70/685* (2026.01)
(Continued)

(52) U.S. Cl.
CPC ........ *H10W 70/611* (2026.01); *H10W 70/685* (2026.01); *H10W 72/0198* (2026.01); (Continued)

(58) Field of Classification Search
CPC ............. H10W 70/611; H10W 70/685; H10W 72/0198; H10W 90/00; H10W 80/00
See application file for complete search history.

(56) References Cited

U.S. PATENT DOCUMENTS 5,019,673 A 5/1991 Juskey et al.
6,410,983 B1 6/2002 Moriizumi et al.
(Continued)

FOREIGN PATENT DOCUMENTS

CN 103515326 B 4/2017
CN 217507310 U 9/2022
(Continued)

OTHER PUBLICATIONS

Anysilicon; "Understanding CoWoS Packaging Technology". (2011) available online at https://anysilicon.com/cowos-pakage/ downloaded Oct. 7, 2024 in 11 pages.
(Continued)

*Primary Examiner* — Nathan W Ha
(74) *Attorney, Agent, or Firm* — Knobbe, Martens, Olson & Bear, LLP

(57) ABSTRACT

A bonded structure is disclosed. The bonded structure can include an interconnect structure that has a first side and a second side opposite the first side. The bonded structure can also include a first die that is mounted to the first side of the interconnect structure. The first die can be directly bonded to the interconnect structure without an intervening adhesive. The bonded structure can also include a second die that is mounted to the first side of the interconnect structure. The bonded structure can further include an element that is mounted to the second side of the interconnect structure. The first die and the second die are electrically connected by way of at least the interconnect structure and the element.

20 Claims, 8 Drawing Sheets

Related U.S. Application Data continuation of application No. 17/171,351, filed on Feb. 9, 2021, now Pat. No. 11,728,273.

(60) Provisional application No. 63/075,038, filed on Sep. 4, 2020.

(51) Int. Cl.
*H10W 72/00* (2026.01)
*H10W 90/00* (2026.01)
*H10W 80/00* (2026.01)

(52) U.S. Cl.
CPC ............ *H10W 90/00* (2026.01); *H10W 80/00* (2026.01); *H10W 90/794* (2026.01)

(56) References Cited

U.S. PATENT DOCUMENTS

| | | | | |
|---|---|---|---|---|
| 6,582,991 | B1 | 6/2003 | Maeda et al. | |
| 7,385,283 | B2 | 6/2008 | Wu et al. | |
| 7,566,634 | B2 | 7/2009 | Beyne et al. | |
| 7,897,481 | B2 | 3/2011 | Chiou et al. | |
| 9,006,908 | B2 | 4/2015 | Pincu et al. | |
| 9,029,242 | B2 | 5/2015 | Holden et al. | |
| 9,054,101 | B2 | 6/2015 | Semmelmeyer et al. | |
| 9,087,832 | B2 | 7/2015 | Huang et al. | |
| 9,165,793 | B1 | 10/2015 | Wang et al. | |
| 9,177,832 | B2 | 11/2015 | Camacho | |
| 9,373,527 | B2 | 6/2016 | Yu et al. | |
| 9,391,143 | B2 | 7/2016 | Tong et al. | |
| 9,443,824 | B1 | 9/2016 | We et al. | |
| 9,466,586 | B1 | 10/2016 | Choi et al. | |
| 9,524,959 | B1 | 12/2016 | Yeh et al. | |
| 9,559,081 | B1 | 1/2017 | Lai et al. | |
| 9,666,502 | B2 | 5/2017 | Chen et al. | |
| 9,666,560 | B1 | 5/2017 | Wang et al. | |
| 9,691,702 | B2 | 6/2017 | Uzoh et al. | |
| 9,704,827 | B2 | 7/2017 | Huang et al. | |
| 9,722,098 | B1 | 8/2017 | Chung et al. | |
| 9,728,527 | B2 | 8/2017 | Uzoh et al. | |
| 9,754,866 | B2 | 9/2017 | Wang et al. | |
| 9,768,133 | B1 | 9/2017 | Wu et al. | |
| 9,780,042 | B2 | 10/2017 | Woychik et al. | |
| 10,002,852 | B1 | 6/2018 | Hu et al. | |
| 10,033,582 | B2 | 7/2018 | Shanimugam et al. | |
| 10,170,409 | B2 | 1/2019 | Ganesan et al. | |
| 10,269,619 | B2 | 4/2019 | Yu et al. | |
| 10,529,690 | B2 | 1/2020 | Shih et al. | |
| 10,529,693 | B2 | 1/2020 | Agarwal et al. | |
| 10,546,834 | B2 | 1/2020 | Wang et al. | |
| 10,559,507 | B1 | 2/2020 | Saketi et al. | |
| 10,629,567 | B2 | 4/2020 | Uzoh et al. | |
| 10,833,052 | B2 | 11/2020 | Shih | |
| 11,145,626 | B2 | 10/2021 | Hwang et al. | |
| 11,222,863 | B2 | 1/2022 | Hua et al. | |
| 11,437,423 | B2 | 9/2022 | Takachi | |
| 11,558,029 | B2 | 1/2023 | Ito | |
| 11,728,273 | B2 * | 8/2023 | Haba .................. | H10W 70/611 257/777 |
| 11,916,076 | B2 | 2/2024 | DeLaCruz et al. | |
| 12,176,294 | B2 * | 12/2024 | Haba .................. | H10W 70/611 |
| 12,322,718 | B2 | 6/2025 | Haba | |
| 2002/0000328 | A1 | 1/2002 | Motomura et al. | |
| 2003/0148591 | A1 | 8/2003 | Guo et al. | |
| 2004/0178495 | A1 | 9/2004 | Yean et al. | |
| 2004/0238927 | A1 | 12/2004 | Miyazawa | |
| 2005/0133930 | A1 | 6/2005 | Savastisuk et al. | |
| 2007/0122635 | A1 | 5/2007 | Lu et al. | |
| 2007/0222048 | A1 | 9/2007 | Huang | |
| 2007/0241440 | A1 | 10/2007 | Hoang et al. | |
| 2007/0295456 | A1 | 12/2007 | Gudeman et al. | |
| 2008/0079105 | A1 | 4/2008 | Chang et al. | |
| 2008/0265421 | A1 | 10/2008 | Brunnbauer et al. | |
| 2008/0308928 | A1 | 12/2008 | Chang | |
| 2009/0001606 | A1 | 1/2009 | Tamadate | |
| 2009/0068831 | A1 | 3/2009 | Enquist et al. | |
| 2009/0102038 | A1 | 4/2009 | Mcelrea et al. | |
| 2009/0149023 | A1 | 6/2009 | Koyanagi | |
| 2009/0227089 | A1 | 9/2009 | Plaut et al. | |
| 2009/0252939 | A1 | 10/2009 | Park et al. | |
| 2009/0283898 | A1 | 11/2009 | Janzen et al. | |
| 2010/0081236 | A1 | 4/2010 | Yang et al. | |
| 2010/0129999 | A1 | 5/2010 | Zingher et al. | |
| 2010/0140759 | A1 | 6/2010 | Pagaila et al. | |
| 2010/0258952 | A1 | 10/2010 | Fjelstad | |
| 2010/0259166 | A1 | 10/2010 | Cok et al. | |
| 2011/0074033 | A1 | 3/2011 | Kaltalioglu et al. | |
| 2011/0140283 | A1 | 6/2011 | Chandra et al. | |
| 2011/0290552 | A1 | 12/2011 | Palmateer et al. | |
| 2011/0304349 | A1 | 12/2011 | Stillman et al. | |
| 2011/0316572 | A1 | 12/2011 | Rahman | |
| 2012/0187516 | A1 | 7/2012 | Sato | |
| 2013/0032390 | A1 | 2/2013 | Hu et al. | |
| 2013/0037936 | A1 | 2/2013 | Choi et al. | |
| 2013/0037962 | A1 | 2/2013 | Xue | |
| 2013/0122655 | A1 | 5/2013 | Yu et al. | |
| 2013/0241080 | A1 | 9/2013 | Pagaila | |
| 2013/0299997 | A1 | 11/2013 | Sadaka | |
| 2014/0013606 | A1 | 1/2014 | Nah et al. | |
| 2014/0071652 | A1 | 3/2014 | McShane et al. | |
| 2014/0154839 | A1 | 6/2014 | Ahn et al. | |
| 2014/0264910 | A1 | 9/2014 | Razdan et al. | |
| 2014/0299981 | A1 | 10/2014 | Goh et al. | |
| 2014/0312511 | A1 | 10/2014 | Nakamura | |
| 2014/0370658 | A1 | 12/2014 | Tong et al. | |
| 2015/0021754 | A1 | 1/2015 | Lin et al. | |
| 2015/0048503 | A1 | 2/2015 | Chiu et al. | |
| 2015/0102468 | A1 | 4/2015 | Kang et al. | |
| 2015/0113195 | A1 | 4/2015 | Kim | |
| 2015/0126139 | A1 | 5/2015 | Chen et al. | |
| 2015/0171050 | A1 | 6/2015 | Chen et al. | |
| 2015/0194406 | A1 | 7/2015 | Teh et al. | |
| 2015/0235991 | A1 | 8/2015 | Gu et al. | |
| 2015/0262845 | A1 | 9/2015 | Hwang et al. | |
| 2015/0303173 | A1 | 10/2015 | Maydar et al. | |
| 2015/0325550 | A1 | 11/2015 | Zhao | |
| 2015/0340285 | A1 | 11/2015 | Enquist et al. | |
| 2015/0371938 | A1 | 12/2015 | Katkar et al. | |
| 2016/0071818 | A1 | 3/2016 | Wang et al. | |
| 2016/0126634 | A1 | 5/2016 | Liu et al. | |
| 2016/0163650 | A1 | 6/2016 | Gao et al. | |
| 2016/0260684 | A1 | 9/2016 | Zhai et al. | |
| 2016/0300813 | A1 | 10/2016 | Zhai et al. | |
| 2016/0300817 | A1 | 10/2016 | Do et al. | |
| 2016/0322330 | A1 | 11/2016 | Lin et al. | |
| 2016/0329284 | A1 | 11/2016 | We et al. | |
| 2016/0343695 | A1 | 11/2016 | Lin et al. | |
| 2016/0379967 | A1 | 12/2016 | Gamini | |
| 2017/0053897 | A1 | 2/2017 | Lai et al. | |
| 2017/0062383 | A1 | 3/2017 | Yee et al. | |
| 2017/0084576 | A1 | 3/2017 | Yu et al. | |
| 2017/0125379 | A1 | 5/2017 | Chen et al. | |
| 2017/0148764 | A1 | 5/2017 | Wang et al. | |
| 2017/0148777 | A1 | 5/2017 | Bono et al. | |
| 2017/0263595 | A1 | 9/2017 | Kurita et al. | |
| 2017/0287874 | A1 | 10/2017 | Fang et al. | |
| 2017/0338214 | A1 | 11/2017 | Uzoh et al. | |
| 2017/0345761 | A1 | 11/2017 | Yu et al. | |
| 2017/0365580 | A1 | 12/2017 | Shih et al. | |
| 2018/0012787 | A1 | 1/2018 | Oka et al. | |
| 2018/0040548 | A1 | 2/2018 | Kim et al. | |
| 2018/0068978 | A1 | 3/2018 | Jeng et al. | |
| 2018/0122774 | A1 | 5/2018 | Huang et al. | |
| 2018/0130769 | A1 | 5/2018 | Tan et al. | |
| 2018/0130772 | A1 | 5/2018 | Yu et al. | |
| 2018/0138101 | A1 | 5/2018 | Yu et al. | |
| 2018/0151477 | A1 | 5/2018 | Yu et al. | |
| 2018/0158749 | A1 | 6/2018 | Yu et al. | |
| 2018/0294241 | A1 | 10/2018 | Chen et al. | |
| 2018/0337157 | A1 | 11/2018 | Wang et al. | |
| 2018/0342435 | A1 | 11/2018 | Yu et al. | |
| 2018/0366437 | A1 | 12/2018 | Chen et al. | |
| 2018/0366442 | A1 | 12/2018 | Gu et al. | |
| 2018/0366446 | A1 | 12/2018 | Haba et al. | |

(56) References Cited

U.S. PATENT DOCUMENTS

| | | | |
|---|---|---|---|
| 2019/0115277 | A1 | 4/2019 | Yu et al. |
| 2019/0131256 | A1 | 5/2019 | Liao et al. |
| 2019/0139851 | A1 | 5/2019 | Myung et al. |
| 2019/0181107 | A1 | 6/2019 | DeLaCruz et al. |
| 2019/0189607 | A1 | 6/2019 | Uzoh et al. |
| 2019/0206791 | A1 | 7/2019 | Pietambaram et al. |
| 2019/0221548 | A1 | 7/2019 | Huang et al. |
| 2019/0371763 | A1 | 12/2019 | Agarwal et al. |
| 2019/0385981 | A1 | 12/2019 | Chen et al. |
| 2020/0006254 | A1 | 1/2020 | Chen et al. |
| 2020/0006309 | A1 | 1/2020 | Chen et al. |
| 2020/0013667 | A1 | 1/2020 | Leobandung |
| 2020/0043853 | A1 | 2/2020 | Kim et al. |
| 2020/0058617 | A1 | 2/2020 | Wu et al. |
| 2020/0118973 | A1 | 4/2020 | Wang et al. |
| 2020/0135594 | A1 | 4/2020 | Lee |
| 2020/0135684 | A1 | 4/2020 | Kim et al. |
| 2020/0176384 | A1 | 6/2020 | Wu et al. |
| 2020/0227367 | A1 | 7/2020 | Haba et al. |
| 2020/0294920 | A1 | 9/2020 | Hariri et al. |
| 2020/0350254 | A1 | 11/2020 | Huang |
| 2020/0395300 | A1 | 12/2020 | Xie et al. |
| 2020/0403006 | A1 | 12/2020 | DeLaCruz et al. |
| 2021/0020577 | A1 | 1/2021 | Hu |
| 2021/0028080 | A1 | 1/2021 | Pietambaram et al. |
| 2021/0057343 | A1 | 2/2021 | Chang et al. |
| 2021/0057352 | A1 | 2/2021 | Agarwal et al. |
| 2021/0066219 | A1 | 3/2021 | Chen et al. |
| 2021/0082797 | A1 | 3/2021 | Lee et al. |
| 2021/0082822 | A1 | 3/2021 | Aleksov et al. |
| 2021/0082825 | A1 | 3/2021 | Strong et al. |
| 2021/0098411 | A1 | 4/2021 | Liff et al. |
| 2021/0098421 | A1 | 4/2021 | Wu et al. |
| 2021/0098422 | A1 | 4/2021 | Elsherbini et al. |
| 2021/0111125 | A1 | 4/2021 | Chen et al. |
| 2021/0125933 | A1 | 4/2021 | Chen et al. |
| 2021/0125965 | A1 | 4/2021 | Lu |
| 2021/0134724 | A1 | 5/2021 | Rubin et al. |
| 2021/0202389 | A1 | 7/2021 | Hsieh et al. |
| 2021/0202396 | A1 | 7/2021 | Wu et al. |
| 2021/0225780 | A1 | 7/2021 | Wu et al. |
| 2021/0280507 | A1 | 9/2021 | Aldrete et al. |
| 2021/0280517 | A1 | 9/2021 | May et al. |
| 2021/0280522 | A1 | 9/2021 | Liu |
| 2021/0296282 | A1 | 9/2021 | Gao et al. |
| 2021/0305122 | A1 | 9/2021 | Lai et al. |
| 2021/0335726 | A1 | 10/2021 | Wu et al. |
| 2021/0375708 | A1 | 12/2021 | Kuo et al. |
| 2021/0375737 | A1 | 12/2021 | Lin |
| 2021/0384133 | A1 | 12/2021 | Ong et al. |
| 2021/0384135 | A1 | 12/2021 | Kuan et al. |
| 2021/0391271 | A1 | 12/2021 | Hsu et al. |
| 2021/0391272 | A1 | 12/2021 | Tsai et al. |
| 2021/0391283 | A1 | 12/2021 | Hsu et al. |
| 2021/0391284 | A1 | 12/2021 | Hsu et al. |
| 2021/0407941 | A1 | 12/2021 | Haba |
| 2022/0005787 | A1 | 1/2022 | Han et al. |
| 2022/0189861 | A1 | 6/2022 | Aleksov et al. |
| 2022/0278084 | A1 | 9/2022 | Ong et al. |
| 2022/0375902 | A1 | 11/2022 | Fay et al. |
| 2023/0207522 | A1 | 6/2023 | Karhade et al. |
| 2023/0343769 | A1 | 10/2023 | Karhade et al. |
| 2024/0047338 | A1 | 2/2024 | Chen et al. |
| 2024/0105704 | A1 | 3/2024 | Zhong et al. |
| 2024/0203917 | A1 | 6/2024 | Katkar et al. |
| 2024/0213191 | A1 | 6/2024 | Theil et al. |
| 2024/0213210 | A1 | 6/2024 | Haba et al. |
| 2024/0217210 | A1 | 7/2024 | Zhao et al. |
| 2024/0222239 | A1 | 7/2024 | Gao et al. |
| 2024/0222315 | A1 | 7/2024 | Uzoh |
| 2024/0222319 | A1 | 7/2024 | Gao et al. |
| 2024/0266255 | A1 | 8/2024 | Haba et al. |
| 2024/0298454 | A1 | 9/2024 | Haba |
| 2024/0304593 | A1 | 9/2024 | Uzoh |
| 2024/0312951 | A1 | 9/2024 | Theil et al. |
| 2024/0332184 | A1 | 10/2024 | Katkar et al. |
| 2024/0332227 | A1 | 10/2024 | Uzoh et al. |
| 2024/0332231 | A1 | 10/2024 | Uzoh |
| 2024/0332267 | A1 | 10/2024 | Haba et al. |
| 2024/0387419 | A1 | 11/2024 | Mrozek et al. |
| 2025/0004197 | A1 | 1/2025 | Haba et al. |
| 2025/0006632 | A1 | 1/2025 | Chang et al. |
| 2025/0006642 | A1 | 1/2025 | Haba et al. |
| 2025/0006674 | A1 | 1/2025 | Uzoh et al. |
| 2025/0006679 | A1 | 1/2025 | Theil et al. |
| 2025/0006689 | A1 | 1/2025 | Uzoh et al. |
| 2025/0054854 | A1 | 2/2025 | Katkar et al. |
| 2025/0079364 | A1 | 3/2025 | Uzoh et al. |
| 2025/0096191 | A1 | 3/2025 | Gao et al. |
| 2025/0112123 | A1 | 4/2025 | Katkar et al. |
| 2025/0279365 | A1 | 9/2025 | Haba |
| 2025/0309125 | A1 | 10/2025 | Haba et al. |
| 2026/0052950 | A1 | 2/2026 | Katkar |
| 2026/0053016 | A1 | 2/2026 | Haba |
| 2026/0144168 | A1 | 5/2026 | Gao |
| 2026/0206546 | A1 | 7/2026 | Variot |

FOREIGN PATENT DOCUMENTS

| | | | |
|---|---|---|---|
| CN | 115995455 | A | 4/2023 |
| JP | 2018-182260 | A | 11/2018 |
| KR | 20170019298 | A | 2/2017 |
| KR | 10-2019-0036266 | A | 4/2019 |
| KR | 10-2019-0050620 | A | 5/2019 |
| KR | 10-2020-0002629 | A | 1/2020 |
| KR | 20200028315 | A | 3/2020 |
| WO | WO 2012/004964 | A1 | 1/2012 |
| WO | WO 2017/087899 | A1 | 5/2017 |
| WO | WO 2017/200717 | A1 | 11/2017 |

OTHER PUBLICATIONS

Dillinger, T., "Intel's EMIB Packaging Technology—A Deep Dive". SemiWiki—Open Forum for Semiconductor Professionals; May 3, 2021; 8 pages.

Kao et al., "Large-size multi-layered fan-out RDL multi-chip module packaging". Chip Scale Review Mar./Apr. 2022; 17-25.

Yu et al., "Study of 15 μm Pitch Solder Microbumpus for 3D IC Integration". In 2009 59th Electronic Components and Technology Conference May 26, 2009 (pp. 6-10).

Enquist; Direct Bond Interconnect for Advanced Packaging Applications; 2007; TFUG Proceedings; website: https://nccavs-usergroups.avs.org/proceedings_tfug/ (Year: 2007).

Michailos, Jean, "Future landscape for 3D Integration: from Interposers to 3D High Density," 3d ASIP—Dec. 13-15, 2016, San Francisco Airport, USA, 46 pages.

European Extended Search Report, re EP Application No. 25227261.2, dated May 20, 2026, 9 pages.

European Examination Report dated Feb. 3, 2026, in EP Application No. 21864897.0, 14 pages.

International Search Report mailed Dec. 8, 2021, issued in International Application No. PCT/US2021/046749, 4 pages.

* cited by examiner

BONDED STRUCTURE WITH INTERCONNECT STRUCTURE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The field generally relates to bonded structures, and in particular, to bonded structures with an interconnect structure.

Description of the Related Art

An electronic component can be connected to a redistribution layer (RDL), which can comprise conductive routing traces to route signals laterally outside the footprint of the electronic component. The RDL can be formed on the electronic component by way of a deposition process. When the RDL is formed, there can be misalignments between the conductive portions of the RDL and contact pads of the electronic component. Accordingly, there remains a continuing need for improved structures and methods for manufacturing an electronic component.

BRIEF DESCRIPTION OF THE DRAWINGS

Specific implementations will now be described with reference to the following drawings, which are provided by way of example, and not limitation.

DETAILED DESCRIPTION OF THE PREFERRED EMBODIMENT

Figure 1A:
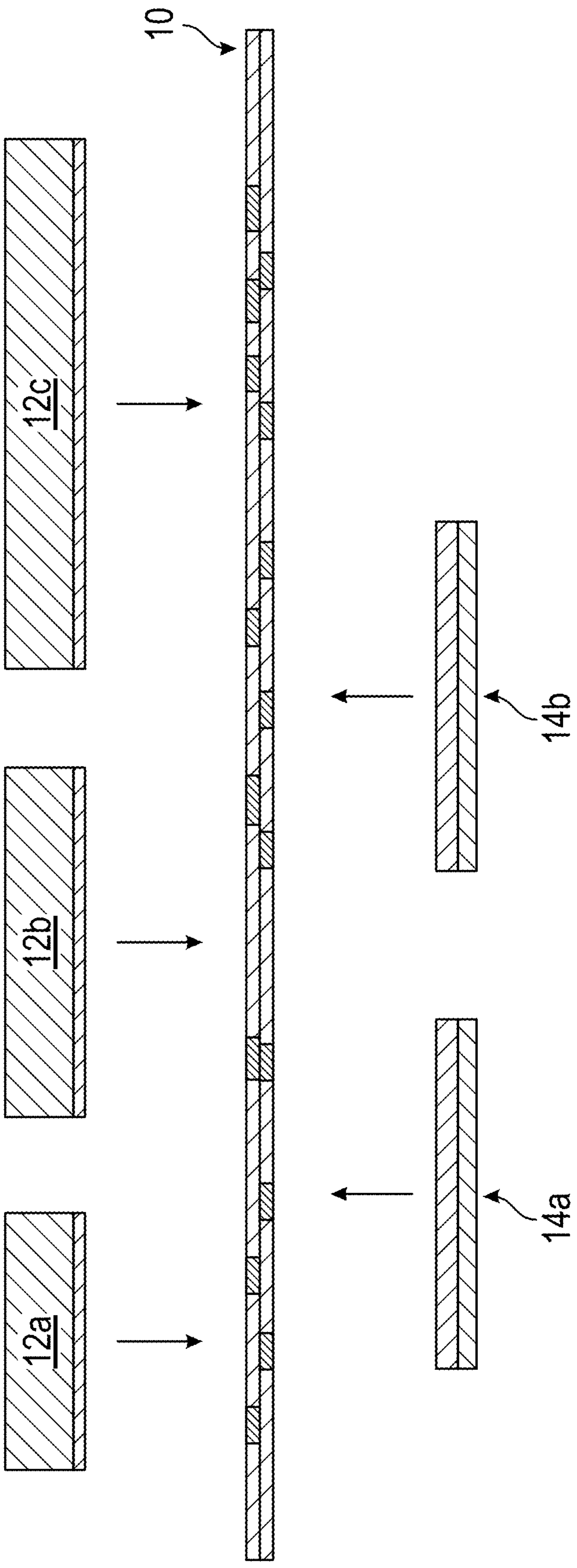
FIG. 1A shows a schematic side view of integrated device dies and a plurality of elements prior to being mounted to an interconnect structure.

Integrated device packages can use a redistribution layer (RDL) to redistribute signals from one or more integrated device dies in the package to other devices (e.g., other devices outside the footprint of the integrated device die). For example, fan-out redistribution can convey signals from finely-pitched bond pads of an integrated device die to other devices laterally spaced from the die. In some implementations, the fan-out RDL can convey signals from a die to leads or contact pads configured to connect to a system board (e.g., a printed circuit board, or PCB). In some implementations, the fan-out RDL can convey signals from the die to other devices, such as other integrated device dies, etc. In some packages that include multiple integrated device dies, the dies may be mounted to a sacrificial carrier, and a molding compound can be provided over the dies and carrier. The sacrificial carrier can be removed, and the molded device dies can be flipped over. The RDL can be deposited over the molding compound and the device dies to form a reconstituted wafer. The reconstituted wafer can be singulated into a plurality of packages, with each package including one or multiple dies connected to an RDL.

However, in reconstituted wafers that utilize a deposited RDL, the dies may have small misalignments relative to their intended position, e.g., rotational and/or translational misalignments. When hundreds or thousands of dies are misaligned across a reconstituted wafer, misalignment of the deposited RDL may accordingly be magnified by a significant amount. In such situations, the misalignment can be compensated for by using a coarse pitch on the die(s) and/or a limited number of interconnects between the dies. However, it may be undesirable to reduce the number of contact pads on the die and/or the number of interconnects between dies. The misalignment problem can be compounded when more than two dies are used in a system. Accordingly, there remains a continuing need for improved alignment of integrated device dies in packages that utilize fan-out redistribution.

Various embodiments disclosed herein can beneficially ensure that multiple device dies are aligned relative to one another by mounting (e.g., directly bonding) the device dies to an interconnect structure (e.g., an RDL) which can serve as an alignment layer to accurately align the dies relative to one another and/or a desired position in the reconstituted wafer. One or more elements can be mounted (e.g., directly bonded) to an opposite side of the interconnect structure to electrically connect laterally spaced device dies. Molding compound can be provided over one or both sides of the interconnect structure, dies, and elements. Directly bonding the device dies and/or connecting elements to a common interconnect structure (e.g., an alignment layer serving as an RDL) can improve alignment between dies. The reconstituted wafer can be singulated to form a plurality of packages, with each package including multiple device dies and connecting elements on opposing sides of the interconnect structure.

Two or more semiconductor elements (such as integrated device dies, wafers, etc.) may be stacked on or bonded to one another to form a bonded structure. Conductive contact pads of one element may be electrically connected to corresponding conductive contact pads of another element. Any suitable number of elements can be stacked in the bonded structure.

Figure 1B:
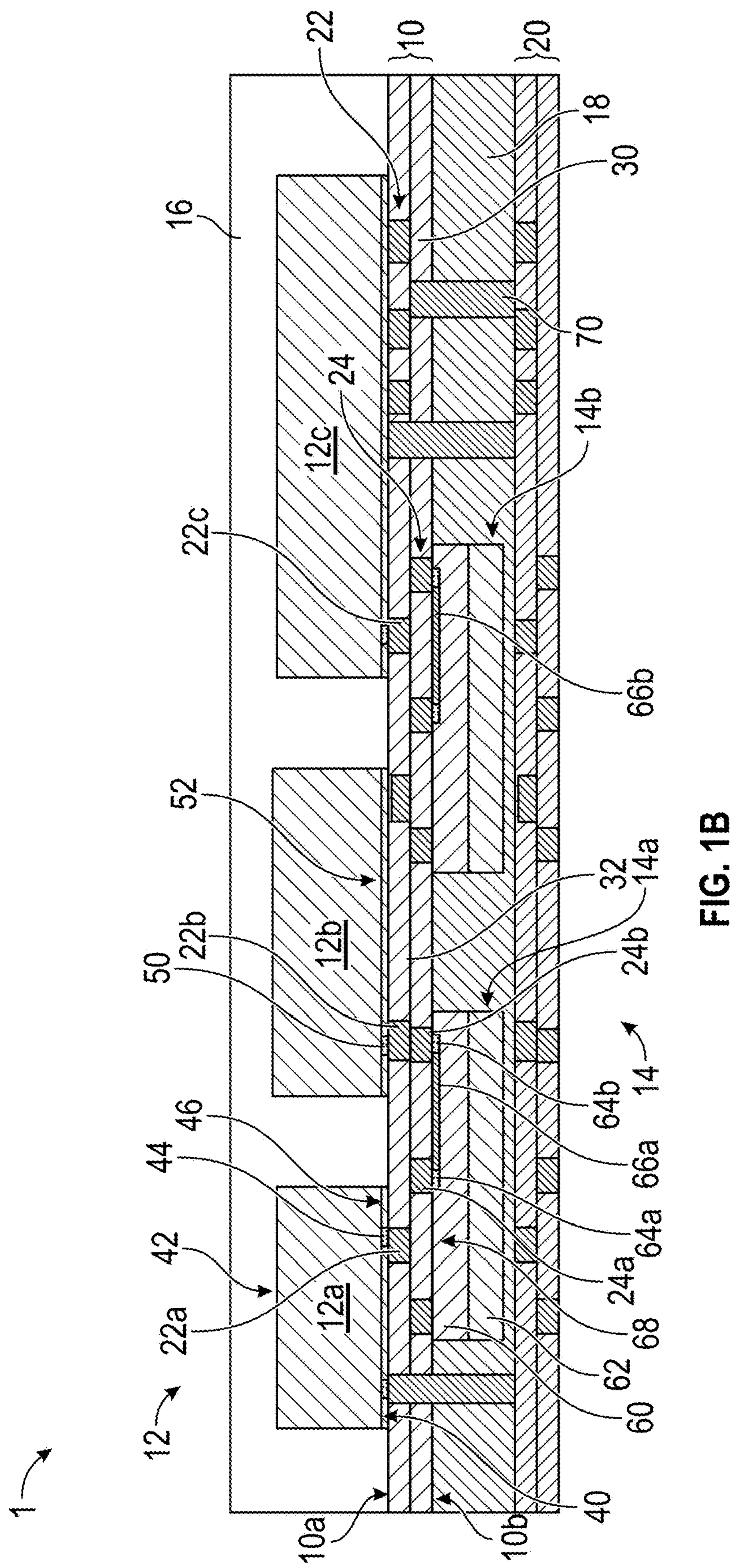
FIG. 1B shows a schematic cross sectional side view of a bonded structure according to an embodiment.

Referring to FIGS. 1A and 1B, in some embodiments, the elements (e.g., a plurality of dies 12 and an interconnect structure 10) are directly bonded to one another without an adhesive. In various embodiments, a non-conductive material 46 of a first element (e.g., a first semiconductor device die with active circuitry or the first integrated device die 12) can be directly bonded to a corresponding dielectric field region (e.g., a non-conductive material 30) of a second element (e.g., a second semiconductor device die with active circuitry or the interconnect structure 10) without an adhesive. The non-conductive material 46 can be referred to as a nonconductive bonding region of the first element. In some embodiments, the non-conductive material of the first element can be directly bonded to the corresponding dielectric field region of the second element using dielectric-to-dielectric bonding techniques. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can be directly bonded to corresponding conductive contact pads of the second element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments and, subsequently, the bonded structure can be annealed. Upon annealing, the contact pads can expand and contact one another to form a metal-to-metal direct bond. Beneficially, the use of Direct Bond Interconnect, or DBI®, techniques can enable high density of pads connected across the direct bond interface (e.g., small or fine pitches for regular arrays). In some embodiments, the pitch of the bonding pads may be less 40 microns or less than 10 microns or even less than 2 microns. For some applications the ratio of the pitch of the bonding pads to one of the dimensions of the bonding pad is less than 5, or less than 3 and sometimes desirably less than 2. In various embodiments, the contact pads can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads can be joined such that copper grains grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes.

FIG. 1A shows a schematic side view of integrated device dies 12*a*-12*c* and a plurality of elements 14*a*-14*b* prior to being mounted to an interconnect structure 10. FIG. 1B shows a schematic cross sectional side view of a bonded structure 1 according to an embodiment. The bonded structure 1 of FIG. 1B may represent a singulated structure that has been separated (e.g., by sawing or punching) from a reconstituted wafer. The bonded structure 1 can include an interconnect structure 10 that has a first side 10*a* and a second side 10*b*, a plurality of integrated device dies 12 (e.g., a first die 12*a*, a second die 12*b*, and a third die 12*c*) that are mounted to the first side 10*a* of the interconnect structure 10, and a plurality of connecting elements 14 (e.g., a first element 14*a* and a second element 14*b*) that are mounted to the second side 10*b* of the interconnect structure 10. The bonded structure can also include a first molding material 16 disposed on the first side 10*a* of the interconnect structure, a second molding material 18 disposed on the second side 10*b* of the interconnect structure, and a second interconnect structure 20.

The first side 10*a* of the interconnect structure 10 can comprise a plurality of conductive contact pads 22 (e.g., a first contact pad 22*a*, a second contact pad 22*b*, and a third contact pad 22*c*), and the second side 10*b* of the interconnect structure 10 can comprise a plurality of conductive contact pads 24 (e.g., a first contact pad 24*a*, a second contact pad 24*b*). In some embodiments, the first contact pad 22*a* and the first contact pad 24*a* can be electrically connected, and the second contact 22*b* and the second contact pad 24*b* can be electrically connected. The first contact pad 22*a* can be laterally offset relative to the first contact pad 24*a*. The second contact pad 22*b* can be laterally offset relative to the second contact pad 24*b*. In some embodiments, the interconnect structure 10 can comprise a redistribution layer (RDL). The interconnect structure 10 can comprise a non-conductive material 30, a plurality of conductive lines 32 formed in the non-conductive material 30, a plurality of conductive vias (not illustrated) formed in the non-conductive material 30. The non-conductive material 30 can comprise any suitable material. For example, the non-conductive material 30 can comprise a dielectric material, such as silicon oxide, or a polymer such as polyimide. In some embodiments, the conductive lines 32 can comprise a power line for providing power to the dies 12. In some embodiments, the conductive lines 32 can comprise signal lines for transferring signals between the dies 12*a*-12*c*. In some embodiments, the conductive lines 32 can transfer or redistribute signals laterally between contact pads (e.g., the first contact pad 22*a* and the second pad 22*b*) on the first side 10*a* and contact pads (e.g., the first contact pad 24*a* and the second contact pad 24*b*) on the second side 10*b*.

The interconnect structure 10 can be provided by way of a transfer process. For example, in some embodiments, the interconnect structure 10 (e.g., an RDL) can be formed on a carrier (such as a semiconductor or glass carrier) and directly bonded to the plurality of dies 12. The carrier can be removed from the interconnect structure 10 to transfer the RDL to the plurality of dies 12. Therefore, in some embodiments, the interconnect structure 10 can comprise a transfer RDL. The first, second, and third dies 12*a*, 12*b*, 12*c* can be spaced apart from one another along the first side 10*a* of the interconnect structure 10. The interconnect structure 10 can beneficially serve to align multiple dies 12*a*, 12*b*, 12*c* and elements 14 relative to a common interconnect structure 10 (e.g., RDL).

In some embodiments, one or more of the plurality of integrated device dies 12 can be flip-chip mounted to the interconnect structure 10. The plurality of integrated device dies 12 can comprise any suitable type of device die. For example, one or more of the plurality of integrated device dies 12 can comprise an electronic component such as a processor die, a memory die, a microelectromechanical systems (MEMS) die, an optical device, or any other suitable type of device die. In other embodiments, the electronic component can comprise a passive device such as a capacitor, inductor, or other surface-mounted device. Circuitry (such as active components like transistors) can be patterned at or near active surface(s) of one or more of the plurality of integrated device dies 12 in various embodiments. The active surfaces may be on a side of one or more of the plurality of integrated device dies 12 which is opposite respective backsides of the one or more of the plurality of integrated device dies 12. The backsides may or may not include any active circuitry or passive devices. The first integrated device die 12 and the second integrated device die 14 may be the same type of integrated device die or a different type of device die.

The first die 12*a* can comprise a bonding surface 40 and a back surface 42 opposite the bonding surface 40. The bonding surface 40 can have a plurality of conductive bond pads including a conductive bond pad 44, and a non-conductive material 46 proximate to the conductive bond pad 44. In some embodiments, the conductive bond pad 44 can be bonded to the first conductive pad 22*a*, and the non-conductive material 46 can be bonded to a portion of the non-conductive material 30. In some embodiments, the conductive bond pad 44 can be directly bonded to the first conductive pad 22*a* without an intervening adhesive, and the non-conductive material 46 can be directly bonded to the portion of the non-conductive material 30 without an intervening adhesive. The non-conductive materials 46, 30 and conductive pads 44, 22*a* can be directly bonded without an adhesive as described throughout U.S. Pat. Nos. 7,126,212; 8,153,505; 7,622,324; 7,602,070; 8,163,373; 8,389,378; 7,485,968; 8,735,219; 9,385,024; 9,391,143; 9,431,368; 9,953,941; 9,716,033; 9,852,988; 10,032,068; 10,204,893; 10,434,749; and 10,446,532, the contents of each of which are hereby incorporated by reference herein in their entirety and for all purposes. In some embodiments, the plurality of integrated device dies 12 can alternatively be bonded to the interconnect structure 10 by way of a thermal conductive bonding (TCB).

The second die 12*b* and the third die 12*c* can be bonded to the interconnect structure in a similar manner as the first die 12*a*. In some embodiments, the second die 12*b* can comprise a plurality of contact pads including conductive contact pad 50 that can be bonded to the conductive contact pad 22*b* of the interconnect structure 10, and a non-conductive material 52 that can be bonded to a portion of the non-conductive material 30 of the interconnect structure 10. In some embodiments, the second die 12*b* can comprise a conductive contact pad 50 that can be directly bonded to the conductive contact pad 22*b* of the interconnect structure 10 without an intervening adhesive, and a non-conductive material 52 that can be directly bonded to a portion of the non-conductive material 30 of the interconnect structure 10 without an intervening adhesive.

In some embodiments, the plurality of elements 14 (e.g., the first element 14*a* and the second element 14*b*) can comprise an interconnect layer 60 and an element body 62. In some embodiments, the interconnect layer 60 can comprise a redistribution layer (RDL) with conductors embedded in an insulating or nonconductive material. In some embodiments, the element body 62 can comprise a substrate, such as a silicon substrate, a glass substrate, etc. In some embodiments, the element body 62 can comprise an integrated device die. In some embodiments, the plurality of elements 14 can comprise a high density interconnect substrate. The elements 14 can beneficially provide electrical communication between the dies 12*a*, 12*b*, 12*c* by connecting to conductors in the interconnect structure 10 that connect to the dies 12*a*-12*c*. In some arrangements, the interconnect structure 10 can include traces that laterally electrically connect the dies 12*a*-12*c*. However, the interconnect structure 10 may comprise one or a few layers, which may not be sufficient for providing dense signal lines between the dies 12*a*-12*c*. Beneficially, the elements 14 can include numerous or dense interconnects and signal lines that can convey a significant number of signals between the dies 12*a*-12*c*. For example, in some embodiments, the interconnect structure 10 can vertically transfer signals from the pads of the die 12*a* to the element 14*a* by way of vias in the interconnect structure 10. The first element 14*a* can transfer the signals laterally by way of traces or conductors 66*a* within the element. The signals can be transferred vertically to the die 12*b* by way of vias in the interconnect structure 10. The second element 14*b* can transfer signals laterally by way of traces or conductors 66*b* within the element.

The first element 14*a* can comprise a first conductive contact pad 64*a*, and a second conductive contact pad 64*b*. The first conductive contact pad 64*a* and the second conductive contact pad 64*b* can be electrically coupled to each other by way of a conductive line 66*a*. The first and second conductive pads 64*a*, 64*b* can be bonded to corresponding pads on the second side 10*b* of the interconnect structure 10. In some embodiments, the first and second conductive pads 64*a*, 64*b* can be bonded to corresponding pads on the second side 10*b* of the interconnect structure 10, in the same or generally similar manner as how the conductive contact pad 44 of the first die 12*a* is bonded to the conductive contact pad 22*a* of the interconnect structure. The element 14*b* can also comprise a non-conductive material 68 that is bonded to the second side 10*b* of the interconnect structure 10. In some embodiments, the non-conductive material 68 can be directly bonded to a portion of the non-conductive material 30 at the second side 10*b* of the interconnect structure 10, in the same or generally similar manner as how the non-conductive material 46 of the first die 12*a* is bonded to a portion the non-conductive material 30 at the first side 10*a* of the interconnect structure 10.

The interconnect structure 10 and the first element 14*a* can define at least a portion of a conductive pathway between the first die 12*a* and the second die 12*b*. In some embodiments, the first element 14*a* and the second element 14*b* can be generally similar. For example, the first element 14*a* and the second element 14*b* can be identically structured. In other embodiments, the first element 14*a* and the second element 14*b* can comprise different structures. Although in FIG. 1B, the first element 14*a* defines a portion of the conductive pathway between the two adjacent dies (the first die 12*a* and the second die 12*b*), in some embodiments, an element may define at least a portion of a conductive pathway between two or more adjacent dies, or two or more remotely located dies on the interconnect structure 10. Electrically coupling the dies 12 to each other only through the interconnect structure 10 (e.g., an RDL, without the elements 14*a*, 14*b*) can cause certain problems and difficulties. For example, forming a conductive routing in the RDL for two or more dies 12 may require a complicated multi-layer structure and the RDL may not be able to provide enough density for proper connection between the dies 12. Also, forming a conductive routing for two or more dies 12 in the interconnect structure can be relatively expensive. Therefore, the elements 14 can provide solutions to these problems and difficulties associated with having the conductive routing for dies 12 in the interconnect structure 10.

The first molding material 16 can comprise a polymer, epoxy, resin, or the like material. In some embodiments, the first molding material 16 provide mechanical support for the first integrated device die 12*a*, the second integrated device die 12*b* and/or the third integrated device die 12*c*. In some embodiments, the first molding material 16 can at least partially be disposed about the first integrated device die 12*a*, the second integrated device die 12*b*, and the third integrated device die 12*c*.

The second molding material 18 can comprise the same or generally similar material as the first material 18. In some embodiments, the first molding material 16 and the second molding material 18 can comprise functionally similar materials. The second molding material 18 can comprise a polymer, epoxy, resin, or the like material. In some embodiments, the second molding material 18 provide mechanical support for the first element 14*a* and/or the second element 14*b*. In some embodiments, the second molding material 18 can at least partially be disposed about the first element 14*a* and the second element 14*b*.

The bonded structure 1 can further include a conductive via 70 formed at least in the second molding material 18. In some embodiments, the conductive via 70 can extend at least partially though a thickness of the second molding material 18. In some embodiments, the conductive via 70 can extend from the second side 10*b* of the interconnect structure 10 to the second interconnect structure 20. In some embodiments, the conductive via 70 can extend from the first side 10*a* of the interconnect structure 10 to the second interconnect structure 20, thereby being in direct contact with one of the plurality of dies 12.

The second interconnect structure 20 can comprise the same or generally similar structure as the first interconnect structure 10. In some embodiments, the first interconnect structure 10 and the second interconnect structure 20 can comprise functionally similar structures.

Figures 2A, 2B, 2C:
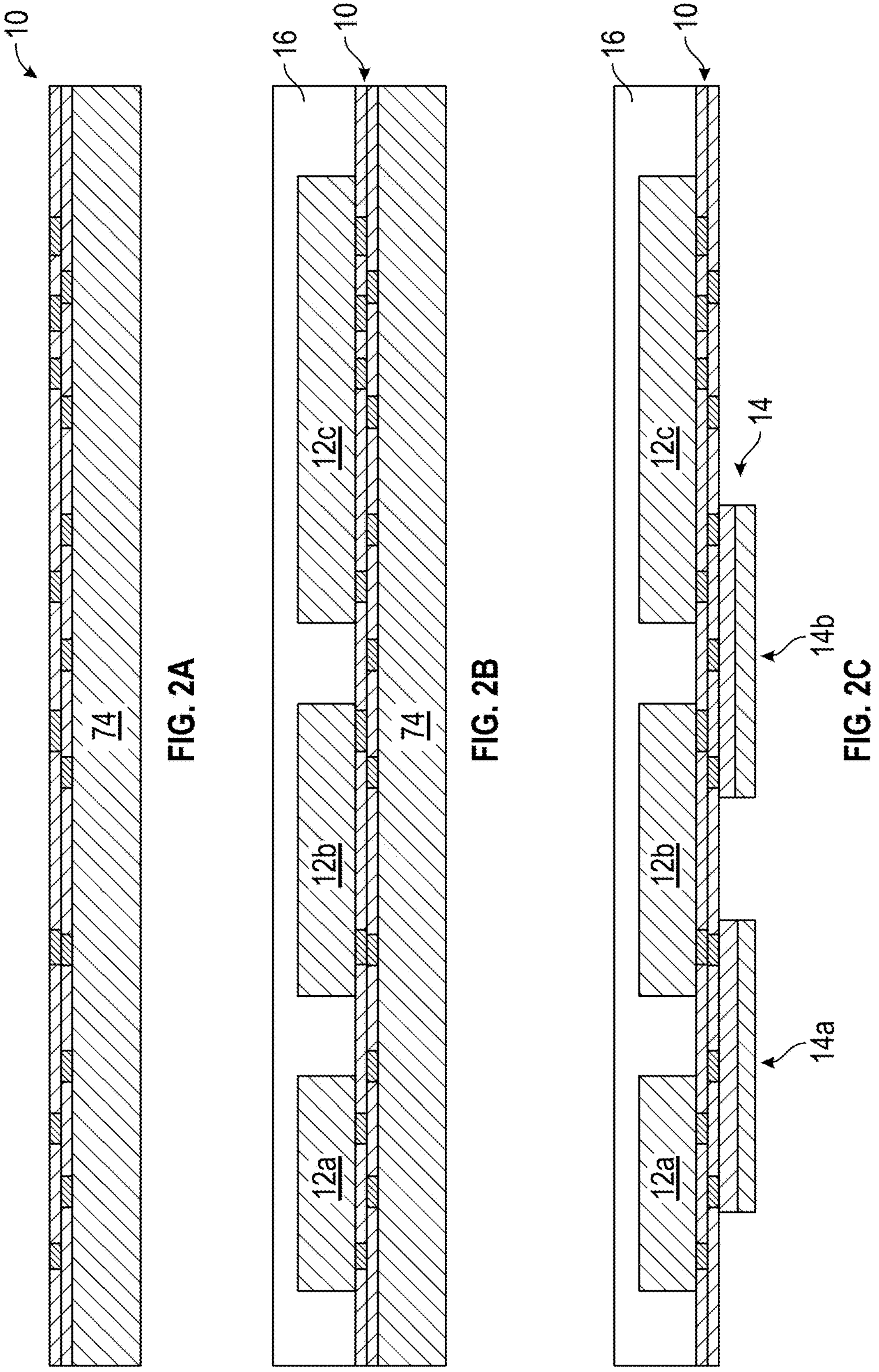
FIG. 2A shows a step in a process of manufacturing a bonded structure according to an embodiment.
FIG. 2B shows another step in the process of manufacturing a bonded structure after FIG. 2A.
FIG. 2C shows another step in the process of manufacturing a bonded structure after FIG. 2B.

FIGS. 2A-2E show a process flow of manufacturing the bonded structure 1 according to one embodiments. FIG. 2A shows a schematic cross sectional side view of an interconnect structure 10 formed on a carrier 74. In some embodiments, the carrier 74 can comprise a semiconductor or glass carrier. At FIG. 2B, a plurality of dies 12 can be provided on a first side 10*a* of the interconnect structure 10. The dies 12 can be directly bonded to the interconnect structure 10 without an adhesive (e.g., conductive contacts and nonconductive field regions of the dies 12 and interconnect structure 10 can respectively be directly bonded to one another). At FIG. 2B, a first molding material 16 can also be provided over the first side 10*a* of the interconnect structure 10, including over the first side 10*a* of the interconnect structure 10, side surfaces of the dies 12, and upper surfaces of the dies 12. The carrier 74 can be removed from the interconnect layer 10. At FIG. 2C, one or more elements 14 can be provided on a second side 10*b* of the interconnect structure 10 opposite the first side 10*a*. In some embodiments, the elements 14 can be directly bonded to the second side 10*b* of the interconnect structure 10 without an adhesive (e.g., conductive contacts and nonconductive field regions of the elements 14 and interconnect structure 10 can respectively be directly bonded to one another). The one or more elements 14 can electrically couple two or more of the plurality of integrated device dies 12 by way of the interconnect structure 10 (e.g., RDL). In some embodiments, the structure shown in FIG. 2C can be a final structure that can be mounted to another device, such as a system board.

Figure 2D:
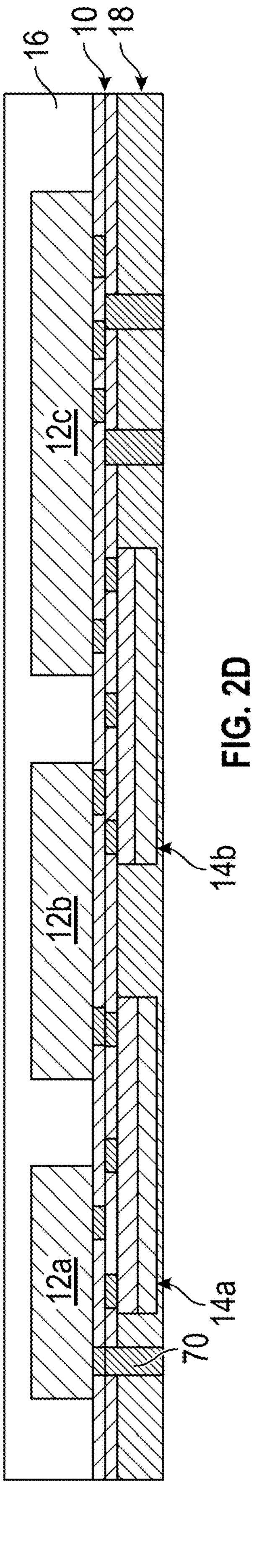
FIG. 2D shows another step in the process of manufacturing a bonded structure after FIG. 2C.

At FIG. 2D, a second molding material 18 can be provided at least partially about the elements 14, e.g., over the second side 10*b* of the interconnect structure 10. In the illustrated embodiment, the elements 14 can be completely embedded in the second molding material 18 such that the second molding material 18 covers side and upper surfaces of the elements 14. In some embodiments, the second molding material 18 can comprise a conductive via 70 that extends at least partially though a thickness of the second molding material 18. In some embodiments, the structure shown in FIG. 2D can be a final structure that can be mounted to another device, such as a system board or other device.

Figure 2E:
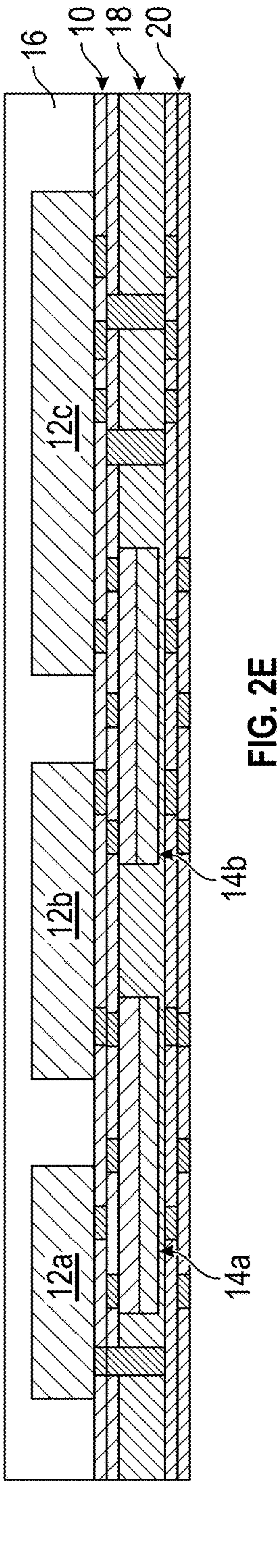
FIG. 2E shows another step in the process of manufacturing a bonded structure after FIG. 2D.

At FIG. 2E, a second interconnect structure 20 can be provided. In some embodiments, the structure shown in FIG. 2E can be a final structure that can be mounted to another device, such as a system board or other device. In some embodiments, the structure shown in FIG. 2E can be mounted to a system board or PCB. In other embodiments, multiple structures such as that shown in FIG. 2E can be stacked on one another, or can be stacked on different types of structures such as reconstituted wafers or elements, dies, interposers, etc.

Figure 3A:
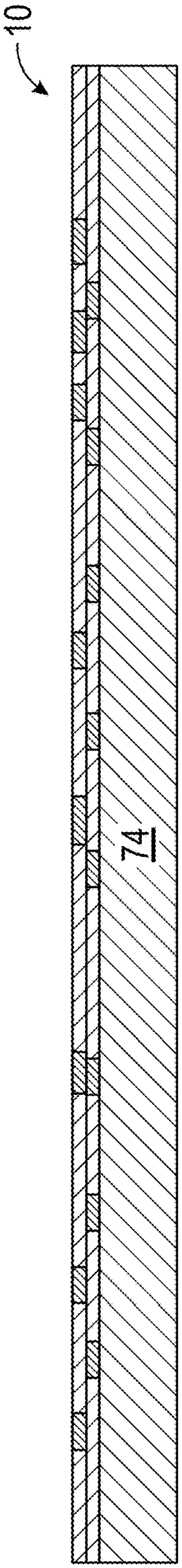
FIG. 3A shows a step in a process of manufacturing a bonded structure according to another embodiment.
Figure 3B:
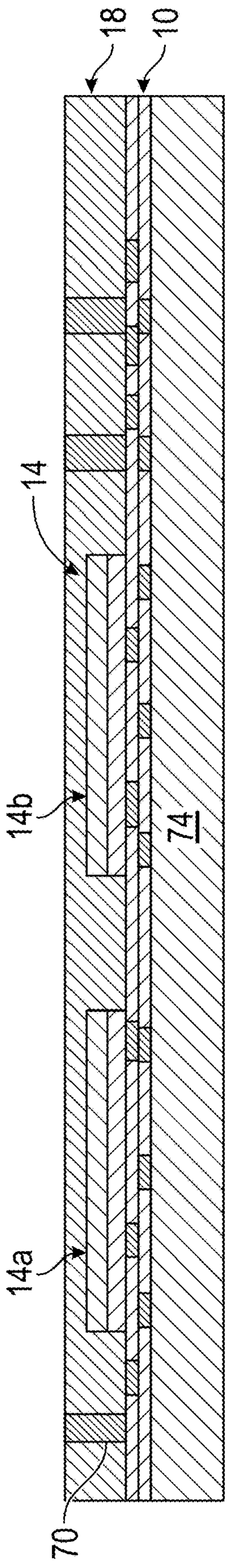
FIG. 3B shows another step in the process of manufacturing a bonded structure after FIG. 3A.

FIGS. 3A-3E show a process flow of manufacturing the bonded structure according to another embodiment. FIG. 3A shows a schematic cross sectional side view of an interconnect structure 10 formed on or in a carrier 74. In some embodiments, the carrier 74 can comprise a semiconductor or glass carrier. At FIG. 3B, one or more elements 14 can be provided on a second side 10*b* of the interconnect structure 10. As explained above, in some embodiments, the elements 14 can be directly bonded to the interconnect structure 10 without an adhesive. A second molding material 18 can be provided at least partially about the elements 14. In some embodiments, the second molding material 18 can comprise a conductive via 70 that extends at least partially through (e.g., completely through) a thickness of the second molding material 18.

Figure 3C:
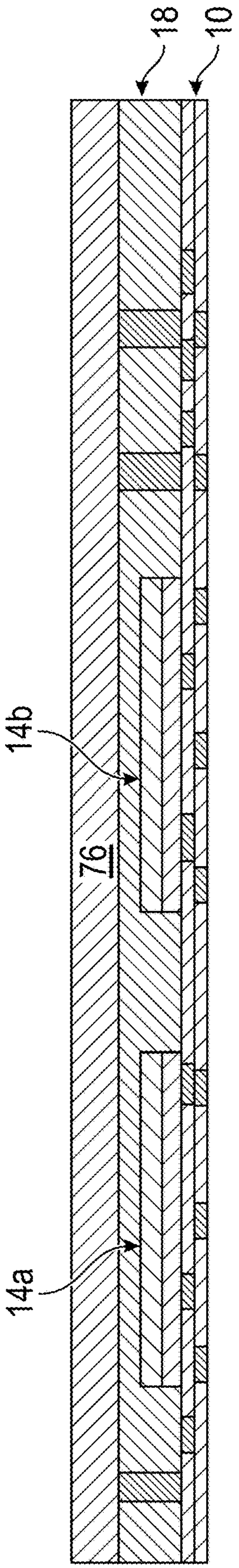
FIG. 3C shows another step in the process of manufacturing a bonded structure after FIG. 3B.
Figure 3D:
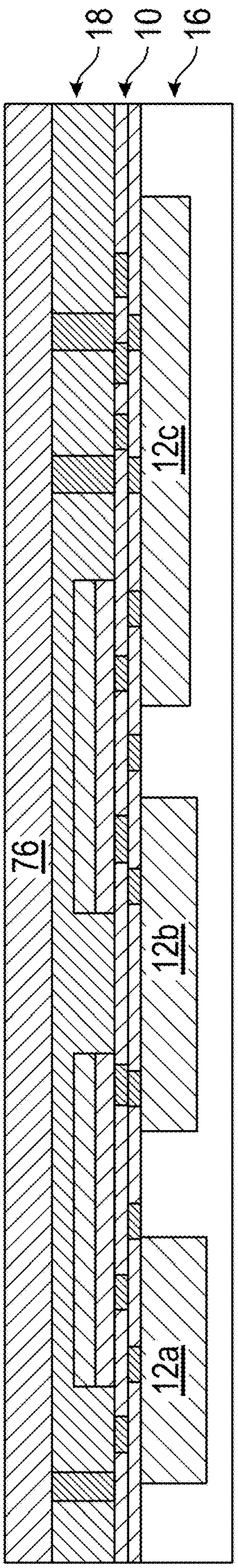
FIG. 3D shows another step in the process of manufacturing a bonded structure after FIG. 3C.
Figure 3E:
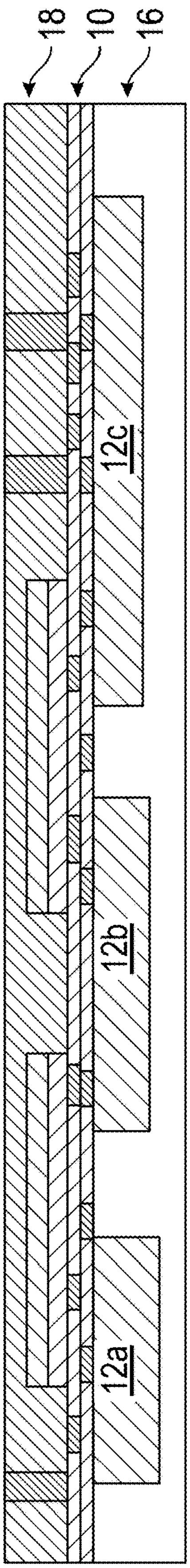
FIG. 3E shows another step in the process of manufacturing a bonded structure after FIG. 3D.

At FIG. 3C, a second carrier 76 can be provided. In some embodiments, the second carrier 76 can comprise a semiconductor or glass carrier. The carrier 74 can be removed from the interconnect layer 10. At FIG. 3D, a plurality of dies 12 can be provided on a first side 10*a* of the interconnect structure 10. As explained above, in some embodiments, the dies 12 can be directly bonded to the interconnect structure 10 without an adhesive. A first molding material 16 can also be provided over the first side 10*a* of the interconnect structure 10. At FIG. 3E, the second carrier 76 can be removed. The structure shown in FIG. 3E can be the same or generally similar as the structure shown in FIG. 2D.

Figure 4:
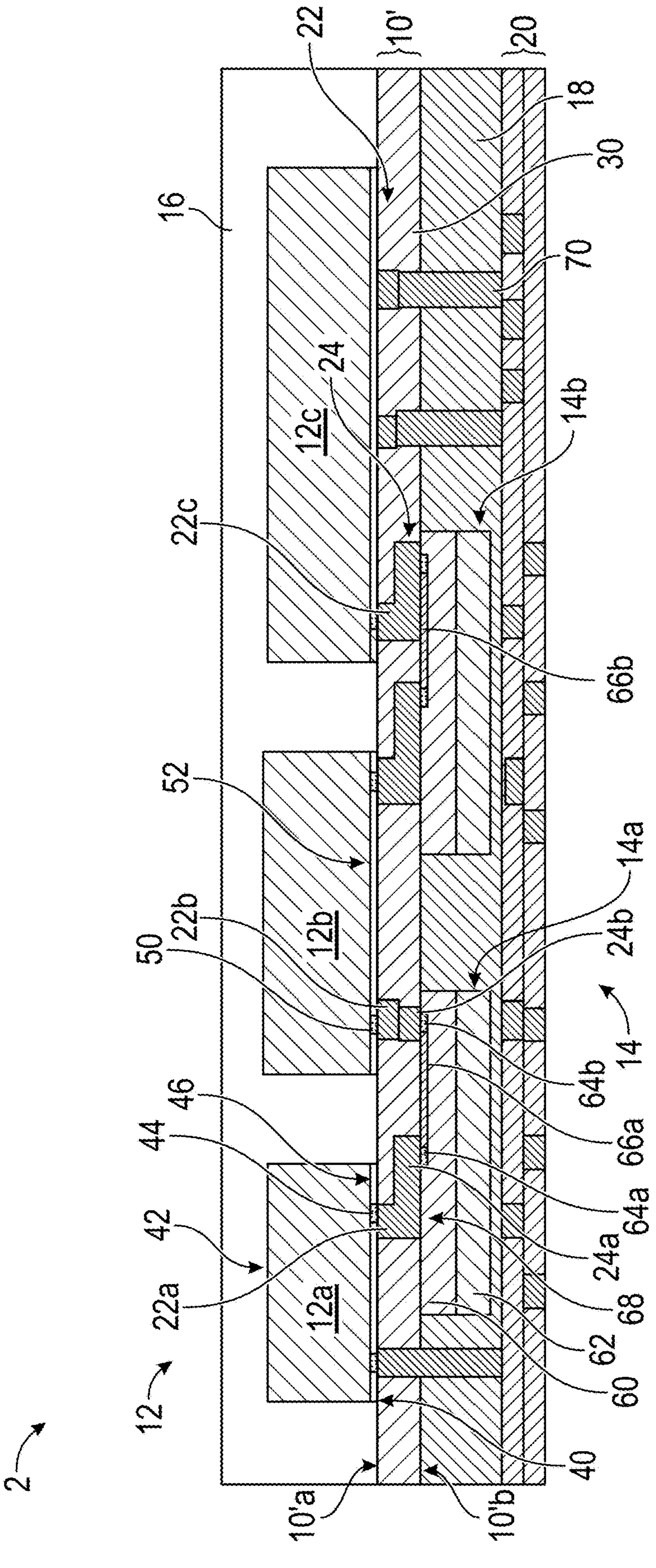
FIG. 4 shows a schematic cross sectional side view of a bonded structure according to another embodiment.

FIG. 4 shows a schematic cross sectional side view of a bonded structure 2 according to an embodiment. Unless otherwise noted, the components of FIG. 4 may be the same as or generally similar to like-numbered components of FIGS. 1A-3E. The bonded structure 2 of FIG. 4 may represent a singulated structure that has been separated (e.g., by sawing or punching) from a reconstituted wafer. The bonded structure 2 can include an interconnect structure 10' that has a first side 10'*a* and a second side 10'*b*, a plurality of integrated device dies 12 (e.g., a first die 12*a*, a second die 12*b*, and a third die 12*c*) that are mounted to the first side 10'*a* of the interconnect structure 10', and a plurality of connecting elements 14 (e.g., a first element 14*a* and a second element 14*b*) that are mounted to the second side 10'*b* of the interconnect structure 10'. The bonded structure can also include a first molding material 16 disposed on the first side 10'*a* of the interconnect structure, a second molding material 18 disposed on the second side 10'*b* of the interconnect structure, and a second interconnect structure 20.

The interconnect structure 10' of FIG. 4, can be generally similar to the interconnect structure 10 illustrated in FIGS. 1A-3E. In the interconnect structure 10', conductive contact pads 22 are not internally connected electrically. For example, the first conductive contact pad 22*a* and the second conductive contact pad 22*b* are not internally connected together electrically within the interconnect structure 10'. Rather, the first conductive contact pad 22*a* and the second conductive contact pad 22*b* are electrically coupled by way of the first conductive contact pad 64*a* and the second conductive contact pad 64*b* of the first element 14*a*, which are respectively connected to the first contact pad 24*a* and the second contact pad 24*b*.

Figure 5:
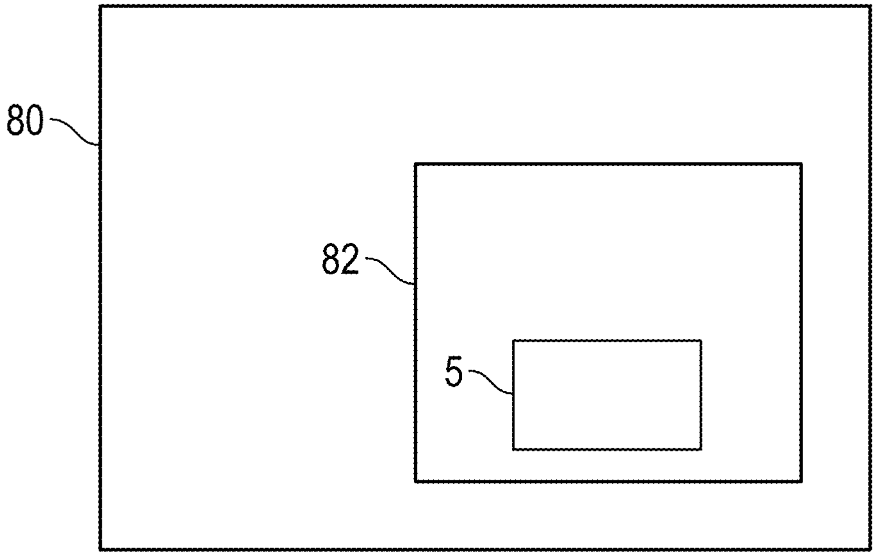
FIG. 5 is a schematic diagram of a system incorporating one or more microelectronic assemblies, according to various embodiments.

FIG. 5 is a schematic diagram of a system 80 incorporating one or more bonded structure 5, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 5. The bonded structures 5 shown in FIG. 5 can comprise any of the bonded structure disclosed herein. The bonded structure 5 can include one or more integrated device dies which perform various functions for the system 80.

In one aspect, a bonded structure is disclosed. The bonded structure can include an interconnect structure that has a first side and a second side opposite the first side. The first side includes a first conductive pad, a second conductive pad, and a non-conductive region. The bonded structure can also include a first die that is mounted and directly bonded to the first side of the interconnect structure. The first die electrically is connected to the first conductive pad of the interconnect structure. The bonded structure can also include a second die that is mounted to the first side of the interconnect structure. The second die is electrically connected to the second conductive pad of the interconnect structure. The second die is spaced apart from the first die laterally along the first side of the interconnect structure. The bonded structure can further include an element that is mounted to the second side of the interconnect structure. The first die and the second die are electrically connected by way of at least the interconnect structure and the element.

In one embodiment, the first die includes a bonding surface. The bonding surface can include a first conductive bond pad and a first non-conductive material. The first conductive bond pad can be directly bonded to the first conductive pad without an intervening adhesive. The first non-conductive material can be directly bonded to a first portion of the non-conductive region without an intervening adhesive. The second die includes a bonding surface. The bonding surface can include a second conductive bond pad and a second non-conductive material. The second conductive bond pad can be directly bonded to the second conductive pad without an intervening adhesive. The second non-conductive material can be directly bonded to a second portion of the non-conductive region without an intervening adhesive.

In one embodiment, the element is directly bonded to the second side of the interconnect structure without an intervening adhesive.

In one embodiment, the first die is mounted to the first side of the interconnect structure by way of a thermal conductive bonding (TCB).

In one embodiment, the interconnect structure includes a redistribution layer (RDL). The RDL layer includes a single layer RDL.

In one embodiment, the element is mounted to the second side of the interconnect structure by way of a thermal conductive bonding (TCB).

In one embodiment, the element includes a third die.

In one embodiment, the element includes a redistribution layer (RDL) formed on a substrate.

In one embodiment, the element include a high density interconnect substrate.

In one embodiment, the bonded structure further includes a first molding material that is disposed over the interconnect structure and at least partially between the first die and the second die.

In one embodiment, the bonded structure further includes a second molding material disposed about the element. The bonded structure can further include a conductive via extending at least through a thickness of the second molding material. The bonded structure can further include a second interconnect structure that is electrically coupled to the interconnect structure through the via. The element can be positioned between the interconnect structure and the second interconnect structure.

In one aspect, a bonded structure is disclosed. The bonded structure can include an interconnect structure that has a first side and a second side opposite the first side. The first side includes a first conductive pad, a second conductive pad, and a non-conductive region. The second side includes a third conductive pad and a fourth conductive pad. The bonded structure can also include a first die that is mounted to the first side of the interconnect structure. The first die is electrically connected to the first conductive pad of the interconnect structure. The bonded structure can also include a second die that is mounted to the first side of the interconnect structure. The second die is electrically connected to the second conductive pad of the interconnect structure. The second die is spaced apart from the first die laterally along the first side of the interconnect structure. The bonded structure further includes an element that is mounted and directly bonded to the second side of the interconnect structure and electrically connected to the third conductive pad and the fourth conductive pad. The element is configured to provide at least a portion of a conductive pathway between the first die and the second die.

In one embodiment, the third conductive pad is laterally offset relative to the first conductive pad.

In one embodiment, the first die includes a bonding surface. The bonding surface can include a first conductive bond pad and a first non-conductive material. The first conductive bond pad can be directly bonded to the first conductive pad without an intervening adhesive. The first non-conductive material can be directly bonded to a first portion of the non-conductive region. The second die can include a bonding surface. The bonding surface can include a second conductive bond pad and a second non-conductive material. The second conductive bond pad can be directly bonded to the second conductive pad without an intervening adhesive. The second non-conductive material can be directly bonded to a second portion of the non-conductive region without an intervening adhesive.

In one embodiment, the element is directly bonded to the second side of the interconnect structure without an intervening adhesive.

In one embodiment, the first die is mounted to the first side of the interconnect structure by way of a thermal conductive bonding (TCB).

In one embodiment, the interconnect structure includes a redistribution layer (RDL). The RDL layer comprises a single layer RDL.

In one embodiment, the element is mounted to the second side of the interconnect structure by way of a thermal conductive bonding (TCB).

In one embodiment, the element includes a third die.

In one embodiment, the element includes a redistribution layer (RDL) formed on a substrate.

In one embodiment, the element includes a high density interconnect substrate.

In one embodiment, the bonded structure further includes a first molding material that is disposed over the interconnect structure at least partially between the first die and the second die.

In one embodiment, the bonded structure further includes a second molding material disposed about the element. The bonded structure can further include a conductive via extending at least through a thickness of the second molding material. The bonded structure can further includes a second interconnect structure that is electrically coupled to the interconnect structure through the via. The element can be positioned between the interconnect structure and the second interconnect structure.

In one aspect, a bonded structure is disclosed. The bonded structure can include an interconnect structure that has a first side and a second side opposite the first side. The first side is configured to support a plurality of dies. The second side includes a first conductive pad, a second conductive pad, and a non-conductive region between the first conductive pad and the second conductive pad. The bonded structure can also include an element that has a bonding surface. The bonding surface includes a first conductive bond pad, a second conductive bond pad, and a non-conductive material between the first conductive bond pad and the second conductive bond pad. The first conductive bond pad and the second conductive bond pad are directly bonded to the first conductive pad and the second conductive pad, respectively, without an intervening adhesive. The non-conductive material is directly bonded to a portion of the non-conductive region. The element is configured to define at least a portion of a conductive pathway between two or more of the plurality of dies.

In one embodiment, the bonded structure further includes a first die that is mounted to the first side of the interconnect structure, and a second die that is mounted to the first side of the interconnect structure. The second die can be spaced apart from the first die laterally along the first side of the interconnect structure. The first die is electrically coupled with the second die by way of at least the interconnect layer and the element. The bonded structure can further include a first molding material disposed over the interconnect structure at least partially between the first die and the second die. The first die can be directly mounted to the first side of the interconnect structure without an intervening adhesive.

In one embodiment, the interconnect structure includes a redistribution layer (RDL). The RDL layer can include a single layer RDL.

In one embodiment, the element includes an integrated device die.

In one embodiment, the element includes a redistribution layer (RDL) formed on a substrate.

In one embodiment, the element includes a high density interconnect substrate.

In one embodiment, the bonded structure further includes a second molding material that is disposed about the element. The bonded structure can further includes a conductive via that extends at least through a thickness of the molding material. The bonded structure can further include a second interconnect structure that is electrically coupled to the interconnect structure through the via. The element is positioned between the interconnect structure and the second interconnect structure.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways.

Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonded structure comprising:

an interconnect structure having a first side and a second side opposite the first side, the first side comprising a first conductive pad, a second conductive pad, and a non-conductive region;

a first die mounted and directly bonded to the first side of the interconnect structure along a bond interface, the first die electrically connected to the first conductive pad of the interconnect structure, the bond interface comprising metal-to-metal direct bonds and dielectric-to-dielectric direct bonds without an intervening adhesive;

a second die mounted to the first side of the interconnect structure, the second die electrically connected to the second conductive pad of the interconnect structure, the second die spaced apart from the first die laterally along the first side of the interconnect structure;

a semiconductor carrier disposed over the first die and the second die; and an element on the second side of the interconnect structure the element comprising an integrated device die including a silicon substrate, wherein the first die, the second die and the element are electrically connected by way of at least the interconnect structure.

2. The bonded structure of claim 1, wherein the interconnect structure comprises a nonconductive material and a plurality of vias to convey signals vertically through the interconnect structure.

3. The bonded structure of claim 2, wherein the element comprises an element body and an interconnect layer on the element body.

4. The bonded structure of claim 3, wherein the interconnect layer comprises traces that laterally connect the first and second dies.

5. The bonded structure of claim 1, wherein the first die comprises a bonding surface, the bonding surface comprising a first conductive bond pad and a first non-conductive material, the first conductive bond pad directly bonded to the first conductive pad without an intervening adhesive, and the first non-conductive material directly bonded to a first portion of the non-conductive region without an intervening adhesive.

6. The bonded structure of claim 5, wherein the second die comprises a bonding surface, the bonding surface comprising a second conductive bond pad and a second non-conductive material, the second conductive bond pad directly bonded to the second conductive pad without an intervening adhesive, and the second non-conductive material directly bonded to a second portion of the non-conductive region without an intervening adhesive.

7. The bonded structure of claim 1, wherein the element is directly bonded to the second side of the interconnect structure without an intervening adhesive.

8. The bonded structure of claim 1, wherein the element comprises a silicon substrate.

9. The bonded structure of claim 1, further comprising a first encapsulant disposed over the interconnect structure at least partially between the first die and the second die.

10. The bonded structure of claim 1, further comprising a second encapsulant material disposed about the element.

11. The bonded structure of claim 10, further comprising a conductive via extending at least through a thickness of the second encapsulant material.

12. The bonded structure of claim 11, further comprising a second interconnect structure electrically coupled to the interconnect structure through the conductive via, the element is positioned between the interconnect structure and the second interconnect structure.

13. The bonded structure of claim 1, wherein the element comprises an active third die.

14. The bonded structure of claim 1, wherein the bonded structure is mounted on a system substrate, the element disposed between the system substrate and the interconnect structure.

15. The bonded structure of claim 14, wherein the system substrate comprises a printed circuit board.

16. The bonded structure of claim 1, wherein the first die comprises a processor die.

17. The bonded structure of claim 16, wherein the second die comprises a processor die.

18. The bonded structure of claim 17, wherein the interconnect structure comprises a plurality of traces to convey signals laterally through the interconnect structure.

19. The bonded structure of claim 1, wherein the interconnect structure comprises a redistribution layer (RDL).

20. The bonded structure of claim 19, wherein the RDL layer comprises a single layer RDL.

* * * * *